(12) United States Patent
Sasaki

(10) Patent No.: US 7,603,595 B2
(45) Date of Patent: Oct. 13, 2009

(54) MEMORY TEST CIRCUIT AND METHOD

(75) Inventor: Tomonori Sasaki, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 315 days.

(21) Appl. No.: 11/642,898

(22) Filed: Dec. 21, 2006

(65) Prior Publication Data

US 2007/0150777 A1    Jun. 28, 2007

(30) Foreign Application Priority Data

Dec. 26, 2005    (JP)    ............................. 2005-371683

(51) Int. Cl.
*G11C 29/00* (2006.01)

(52) U.S. Cl. .............................. 714/718; 714/5; 714/25; 714/42; 714/45; 714/719; 714/723; 714/738; 714/742; 711/156; 365/200; 365/201

(58) Field of Classification Search ........................ None
See application file for complete search history.

(56) References Cited

U.S. PATENT DOCUMENTS

| | | | | |
|---|---|---|---|---|
| 4,876,685 A | * | 10/1989 | Rich | ........................... 714/723 |
| 5,157,664 A | * | 10/1992 | Waite | ........................... 714/710 |
| 6,359,818 B2 | | 3/2002 | Suzuki | |
| 6,523,143 B1 | * | 2/2003 | Kobayashi | .................... 714/718 |
| 6,587,983 B1 | * | 7/2003 | Nakayama | ................... 714/736 |
| 2001/0047500 A1 | * | 11/2001 | Tsuto | ........................ 714/738 |
| 2005/0043912 A1 | * | 2/2005 | Kang et al. | .................. 702/117 |
| 2005/0073332 A1 | * | 4/2005 | Sato | ............................ 324/765 |
| 2005/0149803 A1 | * | 7/2005 | Hirano et al. | ............... 714/738 |
| 2006/0036389 A1 | * | 2/2006 | Ozora et al. | ................. 702/108 |
| 2006/0085712 A1 | * | 4/2006 | Furumi | ........................ 714/732 |
| 2006/0095823 A1 | * | 5/2006 | Fujiwara | ...................... 714/738 |
| 2006/0168498 A1 | * | 7/2006 | Fujiwara | ...................... 714/762 |
| 2007/0150777 A1 | * | 6/2007 | Sasaki | ......................... 714/718 |

FOREIGN PATENT DOCUMENTS

| | | |
|---|---|---|
| JP | 2002-032998 | 1/2002 |
| JP | 2004-086996 | 3/2004 |
| JP | 2004-86996 | * 3/2004 |

* cited by examiner

*Primary Examiner*—John P Trimmings
(74) *Attorney, Agent, or Firm*—Foley & Lardner LLP

(57) ABSTRACT

A memory test circuit according to an embodiment of the invention executes a test on a memory in accordance with a pattern mode signal designating a sub-test pattern included in a test pattern and including a plurality of test actions for the memory, and stores the pattern mode signal as failure information in a failure information storage register. The circuit includes a storage determining circuit determining whether or not to store the failure information in a failure information storage register based on preset failure information storage method information.

11 Claims, 13 Drawing Sheets

| INSTRUCTION CONTROLLER CIRCUIT | CONTROL1 | CONTROL2 |
|---|---|---|
| MODE 1: MEMORY TEST | 0 | 0 |
| MODE 2: SET FAILURE INFORMATION STORAGE METHOD | 1 | 1 |
| MODE 3: OUTPUT FAILURE INFORMATION | 1 | 0 |

Fig. 4

| STORAGE MODE | STORAGE METHOD CODE REGISTER | | STORAGE METHOD CONDITION VALUE REGISTER [FBST-C, FBST-D] | DETECTED FAILURE NUMBER k (>0) | FAILURE ADDRESS VALUE-ad | FAILURE INFORMATION STORAGE |
|---|---|---|---|---|---|---|
| | FBST-A (BINARY NUMBER) | FBST-B (BINARY NUMBER) | | | | |
| 1 | 0 | 0 | 0 or 1 (BINARY NUMBER) | k≧1 | F-ad | STORED |
| 2 | 0 | 1 | n (DECIMAL NUMBER) | k<n | F-ad | NOT STORED |
| | | | | k≧n | F-ad | STORED |
| 3 | 1 | 0 | n (DECIMAL NUMBER) | k≧1 | F-ad=n | NOT STORED |
| | | | | | F-ad≠n | STORED |
| 4 | 1 | 1 | n (DECIMAL NUMBER) | k≧1 | F-ad≠n | NOT STORED |
| | | | | | F-ad=n | STORED |

Fig. 7

| PATTERN-NUMBER | ADDRESS | WRITE | READ |
|---|---|---|---|
| 1 | 0 | – | 000 |
| 2 | 0 | 111 | – |
| 3 | 0 | – | 111 |
| 4 | 1 | – | 000 |
| 5 | 0 | – | 111 |
| 6 | 2 | – | 000 |
| 7 | 0 | – | 111 |
| 8 | 3 | – | 000 |
| 9 | 0 | – | 111 |
| 10 | 0 | 000 | – |
| 11 | 1 | – | 000 |
| 12 | 1 | 111 | – |
| 13 | 1 | – | 111 |
| 14 | 0 | – | 000 |
| 15 | 1 | – | 111 |
| 16 | 2 | – | 000 |
| 17 | 1 | – | 111 |
| 18 | 3 | – | 000 |
| 19 | 1 | – | 111 |
| 20 | 1 | 000 | – |
| 21 | 2 | – | 000 |
| 22 | 2 | 111 | – |
| 23 | 2 | – | 111 |
| 24 | 0 | – | 000 |
| 25 | 2 | – | 111 |
| 26 | 1 | – | 000 |
| 27 | 2 | – | 111 |
| 28 | 3 | – | 000 |
| 29 | 2 | – | 111 |
| 30 | 2 | 000 | – |
| 31 | 3 | – | 000 |
| 32 | 3 | 111 | – |
| 33 | 3 | – | 111 |
| 34 | 0 | – | 000 |
| 35 | 3 | – | 111 |
| 36 | 1 | – | 000 |
| 37 | 3 | – | 111 |
| 38 | 2 | – | 000 |
| 39 | 3 | – | 111 |
| 40 | 3 | 000 | – |

Fig. 11

MEMORY TEST CIRCUIT AND METHOD

BACKGROUND OF THE INVENTION

1. Field of the Invention

The present invention relates to a memory test circuit and method, and more particularly to a test circuit and method capable of detecting a defective portion of a memory.

2. Description of Related Art

In keeping with recent large-scale system LSIs, there is a tendency to increase a capacity of an internal memory. The cells of internal memory become multi-bit. In addition, the number of internal memories has increased. As a method of testing the memories, in general, BIST (built-in self-test) has been used. The BIST enables self-testing in a LSI by incorporating a test pattern generating circuit generating test patterns supplied to a circuit to be tested and a comparator circuit comparing data read from the circuit to be tested with expected value data. According to the BIST, a test pattern generating circuit and an expected value comparator circuit in the LSI are used to generate a memory test pattern in the LSI to test a target memory to output only pass/fail information.

However, what is obtained with a general test method based on BIST is only information about whether or not a failure occurs in the memory. A failure portion of the memory cannot be determined based on this information. For improving memory quality, it is necessary to determine a failure portion and analyze the failure to feed the cause of the failure back to a memory manufacturing process. To that end, there has been required a technique for obtaining information about a failure portion necessary for analyzing a failure of the memory.

Japanese Unexamined Patent Publication No. 2004-86996 (Hirai) discloses a technique of detecting a failure portion upon memory test. FIG. 1 is a block diagram of a memory test circuit of the Related Art 1 disclosed by Hirai. Referring to FIG. 1, the Related Art 1 is described below.

The memory test circuit of FIG. 1 includes a test memory controller circuit 101, a write data generating circuit 102, a memory 103, an expected value generating circuit 104, an expected value comparator circuit 105, a compare register 106, a test item detecting circuit 107, an address register 108, a fail bit detecting circuit 109, an FBM (fail bit map) memory control circuit 110, and an FBM memory 111.

The test memory controller circuit 101 executes write control and read control for testing the memory 103. The write data generating circuit 102 generates data to be written to the memory 103 upon memory test. The memory 103 is a memory to be tested. The expected value generating circuit 104 generates an expected value as a reference that would match with an output data value that is sent from the memory 103 during normal operations upon the memory test. The expected value comparator circuit 105 compares the reference expected value with the output data value from the memory 103. The compare register 106 holds comparison results for all bits, which are sent from the expected value comparator circuit 105. The test item detecting circuit 107 detects a test item number assigned to each of test patterns of the executed memory test. The address register 108 holds an address of a memory cell that sent out an output data value that is being compared by the expected value comparator circuit 105. The fail bit detecting circuit 109 detects a bit the comparison result of which shows that the expected value does not match the output data value, out of all bits held in the compare register 106. The FBM memory controller circuit 110 controls writing to the FBM memory 111 to which failure information is written. The FBM memory 111 stores values output from the test item detecting circuit 107, the address register 108, and the fail bit detecting circuit 109 as failure information.

A memory test mode signal TESTMOD and a test start signal MEMRST supplied from the outside of the LSI are input to the test memory controller circuit 101. A read address signal RADR output from the test memory controller circuit 101 is input to the expected value generating circuit 104 and the address register 108. A read control signal RE output from the test memory controller circuit 101 is input to the expected value generating circuit 104 and the test item detecting circuit 107.

Further, the test start signal MEMRST is also input to the write data generating circuit 102 and the FBM memory controller circuit 110. The write data generating circuit 102 outputs write data WDATA to the memory 103. The write data WDATA is input to the memory 103. Further, the test memory controller circuit 101 outputs a write address signal WADR, a write control signal WE, a read address signal RADR, and a read control signal RE. There signals are input to the memory 103.

Read data RDATA output from the memory 103 and expected value data EXDATA output from the expected value generating circuit 104 are input to the expected value comparator circuit 105. A pass/fail determining signal PASSNG is output from the expected value comparator circuit 105 to the outside of the LSI. Further, comparison data COMPDATA output from the expected value comparator circuit 105 is input to the compare register 106. Comparison result data COMPDATA 2 output from the compare register 106 is input to the fail bit detecting circuit 109. Further, a test suspending signal COMPPNG output from the expected value comparator circuit 105 is input to the test memory controller circuit 101 and the FBM memory controller circuit 110.

A memory analysis mode signal DEBGMOD and an analysis result read signal DEBGREAD supplied from the outside of the LSI are input to the FBM memory controller circuit 110. The FBM memory controller circuit 110 outputs an FBM address signal FBMADR, an FBM write control signal FBMWE, and an FBM read control signal FBMRE to the FBM memory 111.

The FBM memory 111 writes three signals, a test item data signal TESTNO output from the test item detecting circuit 107, an address data signal FAILADR output from the address register 108, and a fail bit signal FAILBIT output from the fail bit detecting circuit 109 as one data signal FBMDATA.

Here, the memory 103 has, for example, 256 addresses and stores 8-bit data. The data FBMDATA written to the FBM memory 111 is, for example, 14-bit data, and upper 3 bits correspond to the output signal TESTNO of the test item detecting circuit 107, subsequent 8 bits correspond to the output signal FAILADR of the address register 108, and the remaining 3 bits correspond to the output signal FAILBIT of the fail bit detecting circuit 109.

If a memory cell capable of storing data of 14 or more bits is used as the FBM memory 111, the failure information can be stored at a time. A capacity of the FBM memory 111 is determined based on the bit width of the memory 103 to be tested and the number of stored failure information. A signal output from the FBM memory 111 becomes an FBM read-out signal FBMOUT to be output from the LSI.

Operations of the memory test circuit of FIG. 1 are described next. A memory test mode signal TESTMOD supplied from the outside of the LSI sets a memory test mode. The test start signal MEMRST is input to thereby reset the test memory controller circuit 101, the write data generating circuit 102, and the FBM memory controller circuit 110. Further, the write data generating circuit 102 starts generating the write data WDATA.

Subsequently, the test memory controller circuit 101 generates a write address signal WADR and a write control signal WE to be written to a memory cell. Further, the write data WDATA is written to the memory 103. If data is written to all addresses, the write address signal WADR and the write control signal WE are stopped.

Next, the test memory controller circuit 101 generates the read control signal RE and the read address signal RADR. Further, the expected value generating circuit 104 generates expected value data EXDATA corresponding to the read address signal RADR.

The expected value data EXDATA generated with the expected value generating circuit 104 is compared with the read data RDATA read from the memory cell by the expected value comparator circuit 105. Based on the comparison result, the expected value comparator circuit 105 outputs a high-level signal if read data of all bits match with the expected data. If the read data for only 1 bit does not match the expected value, a low-level signal is output as the pass/fail determining signal PASSNG. Further, the read address signal RADR is stored in the address register 108 unless a comparison result corresponding to an address value is obtained. Further, the test item detecting circuit 107 counts read control signals RE to detect a test item number TESTNO representing a position of a sub-test pattern in the test pattern. The test item number TESTNO is information for determining which test item of the test pattern a failure occurs in. A test pattern of this time can be known based on the test item number TESTNO.

Further, provided that the memory analysis mode signal DEBGMOD supplied from the outside of the LSI is a high-level one, and an operational mode is a memory analysis mode, if a comparison result of the expected value comparator circuit 105 is negative, the test suspending signal COMPPNG is switched to a high level during a period corresponding to fail bits. Reading the next address is stopped in the test memory controller circuit 101 only during a period one clock shorter than a period where the test suspending signal COMPPNG is at high level. That is, if a failure is found for one 1 bit, the operation is not stopped. If a failure is found for 3 bits, the operation is stopped for a period corresponding to 2 clocks.

Further, the comparison data COMPDATA for all bits that are sent from the expected value comparator circuit 105 are held in the compare register 106, and the fail bit detecting circuit 109 detects an unmatched bit value. The test item number, the failure address, and the failure bit are concurrently written to the FBM memory 111 as one failure information. If only a failure of 1 bit is found at 1 address, the data needs only to be written once. If failures of plural bits are found, the fail bit detecting circuit 109 detects fail bits in order, and the data is written to the FBM memory 111 plural times. A FBM memory cell control circuit 110 counts FBM address signals FBMADR if the test suspending signal COMPPNG is a high-level one.

Further, after the completion of testing, if the analysis result read signal DEBAGREAD is at high level, the FBM memory controller circuit 110 enters a read mode, and failure information is read from the FBM memory 111 and output as the FBM read-out signal FBMOUT.

Meanwhile, Japanese Unexamined Patent Publication No. 2002-32998 (Suzuki) discloses another technique of detecting a failure portion upon memory test. FIG. 2 is a block diagram of a memory test circuit of the Related Art 2 disclosed by Suzuki. Referring to FIG. 2, the memory test circuit of the Related Art 2 is described below.

The memory test circuit of the Related Art 2 as shown in FIG. 2 includes a memory 201, a memory BIST circuit 202, and a logic scan chain circuit 203. Further, the memory BIST circuit 202 includes an address counter circuit 2021, a data generating circuit 2022, a comparator circuit 2023, and a BIST controller circuit 2024. The logic scan chain circuit 203 includes plural scan register groups 203-1 to 203-n.

The memory 201 is a memory to be tested. An address counter circuit 2021 generates an address for testing the memory 201. The data generating circuit 2022 generates an expected value as a reference which would match with an output data value sent from a memory under normal operations upon the memory test. The comparator circuit 2023 compares the reference expected value generated with the data generating circuit 2022 with an output data value from the memory 201. The BIST controller circuit 2024 controls the address counter circuit 2021, the data generating circuit 2022, and the comparator circuit 2023 for generating a memory test pattern.

The logic scan chain circuit 203 is used for a testing method called scan test that flip-flops (F/Fs) out of logic circuits except a memory are connected through a line 205 in a test mode to realize shift register configuration to thereby improve controllability and observability for testing the memory. The logic scan chain circuit 203 is divided into scan register groups 203-1, 203-2, . . . , 203-n in accordance with the number of F/Fs that can store failure information. The scan register groups 203-1, 203-2, . . . , 203-n are configured to shift data in a direction 204 from the scan register group 203-1 toward the scan register group 203-2.

Operations of the memory test circuit of the Related Art 2 are described next. If the memory BIST circuit 202 becomes active, the BIST controller circuit 2024 becomes active to start testing the memory 201. Upon the memory test, the logic scan chain circuit 203 shifts data in the direction 204 from the scan register group 203-1 to the scan register group 203-2.

The comparator circuit 2023 of the memory BIST circuit 202 compares an output data value from the memory 201 with an output expected value from the data generating circuit 2022. If a failure is detected as a result of comparison, an address value where the failure is detected and a data value representing the failure determination result output from the comparator circuit 2023 are input to the scan register group 203-1 as failure information. From then onward, the memory test is continued even after a failure is detected. If the next failure is found, the data stored in the scan register group 203-1 is shifted to the scan register group 203-2, and the found-failure information is input to the scan register group 203-1 this time. In this way, the failure information is captured by the logic scan chain circuit 203 while being shifted, thereby making it possible to capture up to n failure information. After the completion of the memory test, the failure information held in the logic scan chain circuit 203 is shifted and output to the outside from an SDO (Serial data out), making it possible to obtain the failure information.

In the Related Art 1, the FBM memory 111 stores, as failure information, a test item number, a failure address, and a fail bit. The test item number is determined such that the test item detecting circuit 107 counts read control signals RE to determine a position in the memory test pattern. The test item number is used for determining which test pattern a failure occurs in. However, a test pattern for testing the memory 103 is obtained by combining sub-test patterns ""0" is written as a data value to memory cells-in ascending order of addresses", "data is read from the memory cells in descending order of addresses", ""0" and "1" are alternately written to the memory cells in descending order of addresses", ""0" and "1"

are alternately read from the memory cells in ascending order of addresses". Thus, the memory test circuit of the Related Art 1 includes only information about the number of read data in the memory test pattern. Therefore, unless compared with all sub-test patterns of the used memory test pattern, it cannot be determined how a memory under test is operating when a failure occurs. That is, there arises a problem in that, unless all sub-test patterns of the memory test pattern are grasped, a failure portion cannot be checked.

Further, in the Related Art 1, failure information is written to the FBM memory 111. However, there is another problem in that, if a memory large enough to store failure information cannot be prepared, failure information remains to be stored.

On the other hand, in the Related Art 2, a failure address and a fail bit are stored as failure information. However, there is a problem in that which test pattern is executed and where a sub-test pattern involving a failure is in the memory test pattern cannot be determined based oh the information about the address and fail bit alone.

Further, in the Related Art 2, the logic scan chain circuit 203 captures the failure information. However, similar to the Related Art 1, there is another problem in that failure information remains to be stored if exceeding a memory capacity.

SUMMARY OF THE INVENTION

A memory test circuit according to an aspect of the invention includes: a testing unit testing a memory in accordance with a pattern mode signal designating a sub-test pattern included in a test pattern and including a plurality of test actions for the memory; and a storage unit storing the pattern mode signal as failure information. According to the present invention, a pattern mode signal designating a sub-test pattern is stored as failure information, making it possible to easily grasp a failure portion.

Further, a memory test circuit according to another aspect of the invention includes: a failure information detecting circuit detecting failure information of a memory; and a storage determining circuit determining whether or not failure information detected with the failure information detecting circuit is stored in a failure information storage circuit based on preset failure information storage method information. According to the present invention, it is determined whether or not the failure information is stored based on the failure information storage method information, so all failure information can be collected with a small memory capacity for the failure information.

According to the present invention, it is possible to provide memory test circuit and method which can easily grasp a failure portion and collect all failure information with a small memory capacity.

BRIEF DESCRIPTION OF THE DRAWINGS

The above and other objects, advantages and features of the present invention will be more apparent from the following description taken in conjunction with the accompanying drawings, in which:

FIG. 4 is an output control signal table showing operations of an instruction controller circuit according to the embodiment of the present invention;

FIG. 7 is an operation chart of operations of a storage determining circuit according g to the embodiment of the present invention;

FIG. 11 shows an example of a sub-test pattern of a memory test pattern according to the embodiment of the present invention;

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Figure 1:
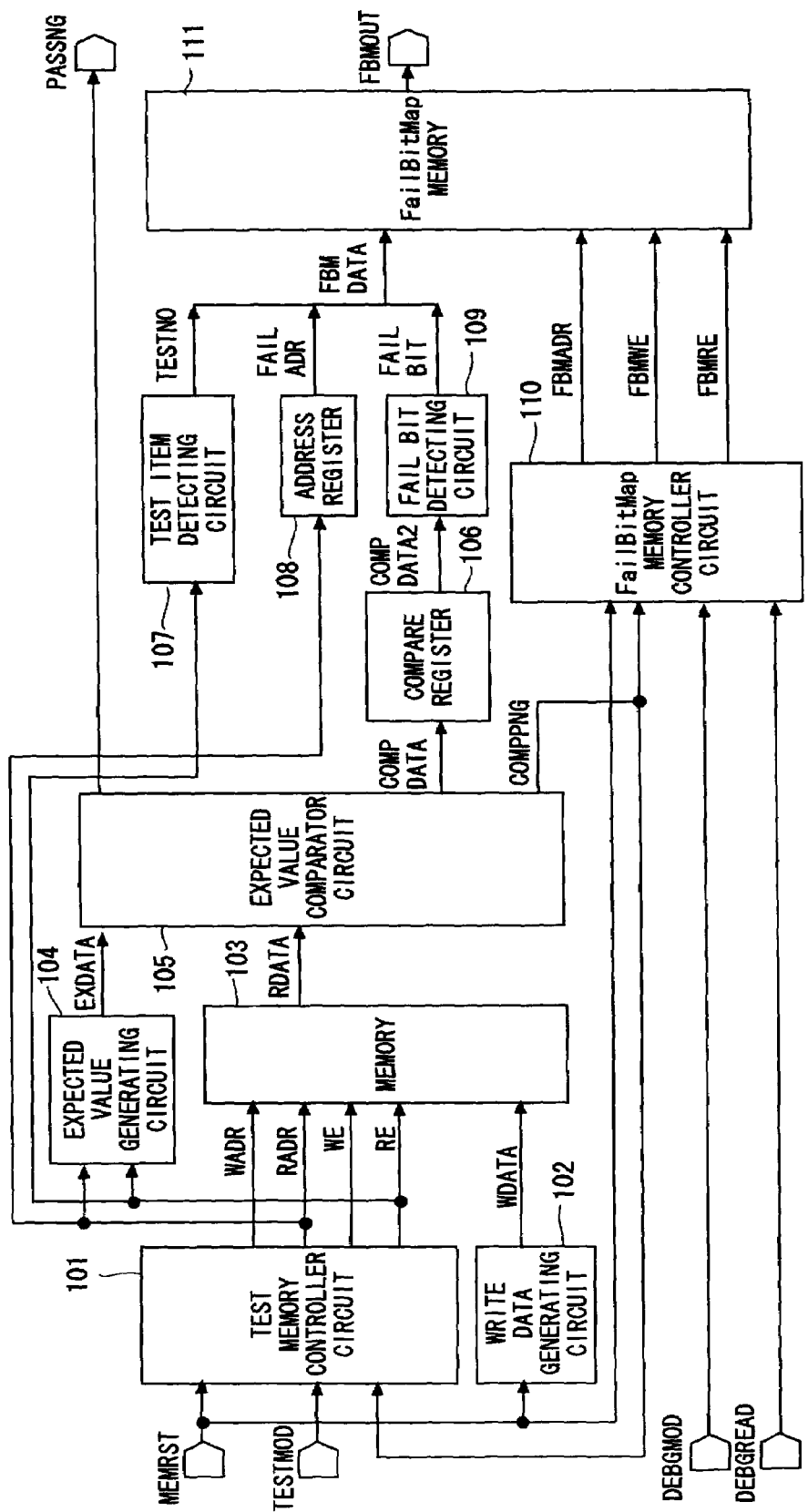
FIG. 1 is a diagram of a test memory circuit of the Related Art 1.
Figure 2:
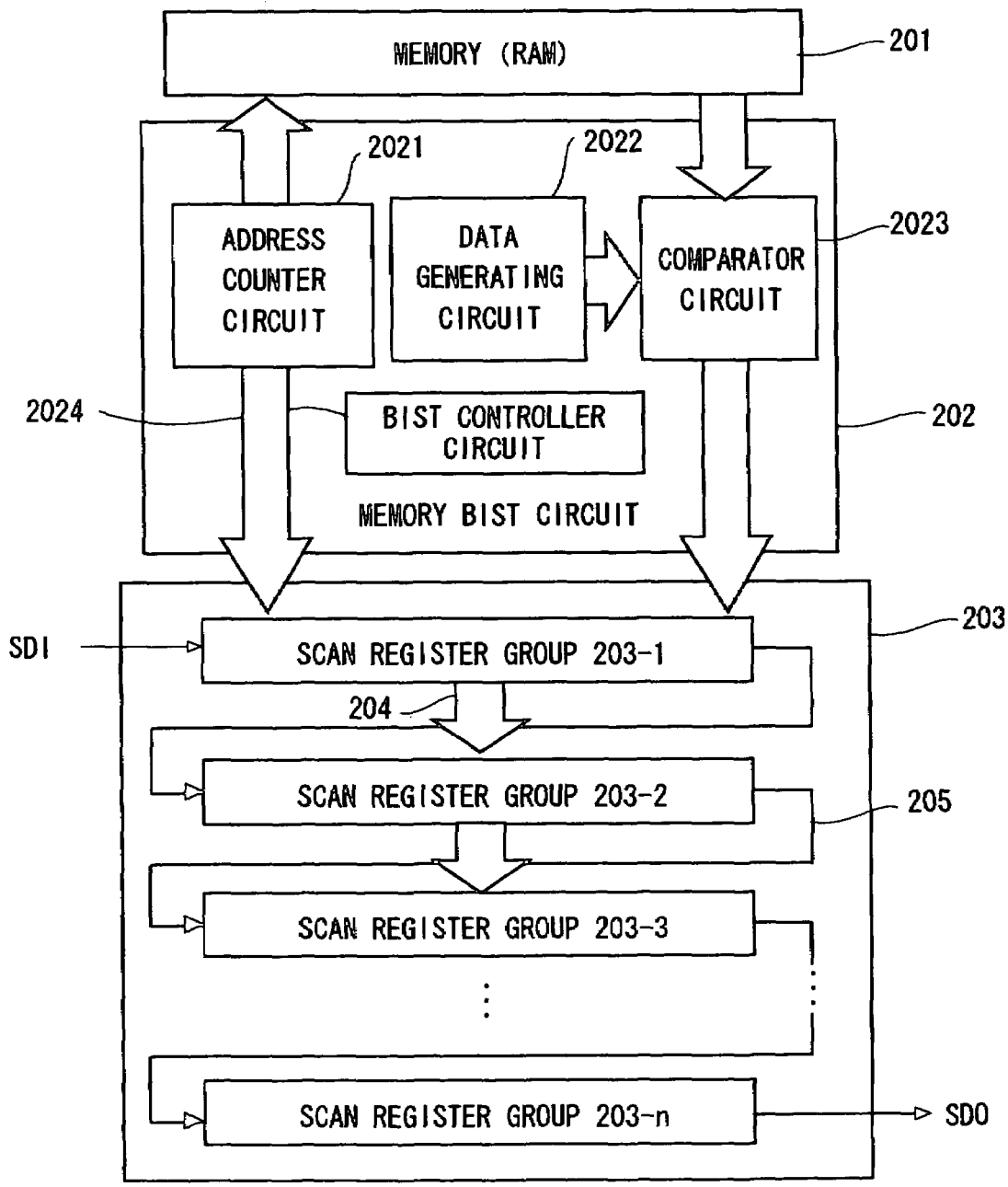
FIG. 2 is a diagram of a test memory circuit of the Related Art 2.
Figure 3:
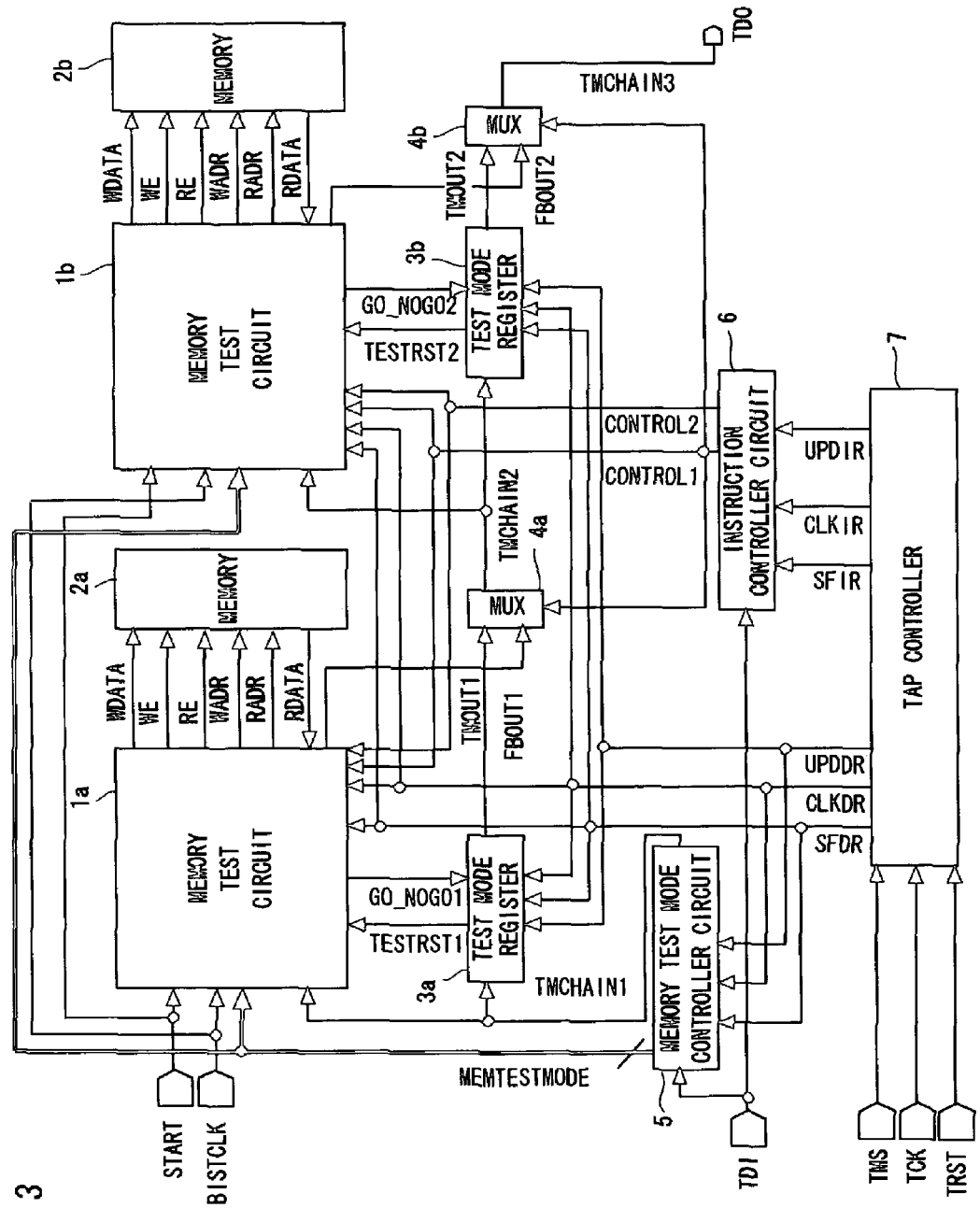
FIG. 3 is a diagram of an overall circuit including a memory test circuit according to an embodiment of the present invention.

First, the configuration of a memory test circuit according to an embodiment of the present invention is described. FIG. 3 shows the configuration of an overall circuit (semiconductor device) including the memory test circuit of this embodiment.

A memory test circuit 1a is configured by a failure information collecting circuit and a BIST circuit as main circuits of the present invention. A memory test start control signal START and a memory test circuit clock signal BISTCLK are input from an external tester or the like to a memory test circuit 1a through terminals. A memory test circuit 1b has the same configuration as that of the memory test circuit 1a, and similar signals are input to the memory test circuit 1b.

A memory 2a is a memory to be tested. In this embodiment, for facilitating understanding, the memory 2a has 4 addresses and stores data of 3 bits. The memory 2a receives a write control signal WE, a write address WADR, a write data WDATA, a read control signal RE, and a read address RADR from a memory test circuit 1a, and read data RDATA is output from the memory 2a to the memory test circuit 1a. A memory 2b has similar configuration and receives similar signals.

A test mode register 3a outputs a control signal TESTRST1 for making the memory test circuit 1a active. Further, the test mode register 3a receives a pass/fail determination result signal GO_NOGO1 from the memory test circuit 1a. The test mode register 3a is configured by shift registers, and a set value is input from an external terminal TDI. A test mode register 3b has the same configuration as the test mode register 3a, and similar signals are input/output.

The selectors 4a and 4b are selectors (MUX) selecting a signal to be output from an external output terminal TDO. The selectors 4a and 4b select output signals FBOUT1 and FBOUT2 of failure information collected with the memory test circuits 1a and 1b or test mode signals TMOUT1 and TMOUT2 input from an external input terminal TDI to the test mode registers 3a and 3b to output the selected one.

The memory test mode controller circuit 5 outputs a pattern mode signal MEMTESTMODE designating which sub-test pattern of the memory test pattern is generated. The pattern mode signal MEMTESTMODE is supplied to the memory test circuits 1a and 1b. In this embodiment, the memory test mode controller circuit 5 is configured by shift registers, and a set pattern mode signal value is input from the external terminal TDI. In this embodiment, the pattern mode signal MEMTESTMODE is supplied from the outside of the LSI to the memory test circuit but may be generated by the memory test circuit itself.

In this embodiment, the memory test circuit 1a and 1b generate sub-test patterns of FIG. 11 to carry out the memory test. The sub-test patterns constitute the test pattern, and include plural action steps. The sub-test pattern is; for example, ""0" is written as a data value to memory cells in ascending order of addresses", "data is read from the memory cells in descending order of addresses", ""0" and "1" are alternately written to the memory cells in descending order of addresses", and ""0" and "1" are alternately read from the memory cells in ascending order of addresses", and is a group of test action steps.

A pattern mode signal MEMTESTMODE designating a sub-test pattern includes three mode designating regions (address mode, Read/Write mode, data mode). An address mode region is used for designating an address action of a sub-test pattern to be generated. The Read/Write mode region is used for designating a memory read action and memory write action of the sub-test pattern to be generated. The data mode region is used for designating a data value to be written to a memory and an expected value to be generated. Each mode region includes an arbitrary number of bits. To given an example thereof, the address mode region includes 3 bits, the Read/Write mode region includes 3 bits, and the data mode region includes 2 bits. A series of actions of the sub-test pattern corresponds to one mode value.

For example, if it is designated that the address mode="3'b001", this means an action that "address values are generated in ascending order from 0". Further, if it is designated that the Read/Write mode ="3'b001", this means an action "write data". If it is designated that the data mode="2'b00", this means an action "output "0"". If the three modes are combined to designate the pattern mode signal MEMTESTMODE={"001", "001", "00"}, a signal for generating a sub-test pattern representing a series of actions "data value "0" is written in ascending order of addresses" is obtained.

In this embodiment, the sub-test pattern of FIG. 11 is generated, and a pattern mode signal MEMTESTMODE designating the sub-test pattern is such that the address mode=3'b101, the Read/Write mode=3'b101, and the data mode=2'b11. The sub-test pattern of FIG. 11 is assumed to test a 4-address, 3-bit memory. Prior to memory test based on the sub-test pattern, a data value "0" is written to all addresses of the memory. In FIG. 11, each Pattern-Number (pattern number) represents an action step. The sub-test pattern of this example includes 40 actions steps from 1 to 40 steps, and the actions are executed in order from 1 to 40. In the table, Address represents an address value of the memory, Write represents a write data value, and Read represents a read data value. A pattern number 2 is a pattern to write "111" to an area at address "0" in a memory to be tested.

If a mode 1, a mode 2, and a mode 3 are set in the instruction controller circuit 6 as shown in FIG. 4, the instruction controller circuit 6 outputs control signals CONTROL1 and CONTROL2 for executing an action corresponding to the mode. The control signals CONTROL1 and CONTROL2 are supplied to the selectors 4a and 4b and the memory test circuits 1a and 1b. As shown in FIG. 4, the mode 1 is to execute memory test, the mode 2 is to set a failure storage method, and the mode 3 is to output failure information.

The TAP controller 7 is a state machine having 16 states defined by the IEEE Std. 1149. The TAP controller 7 is externally supplied with a clock signal TCK, a reset signal TRST, and a state transition control signal TMS through each terminal and controlled. Based on the state of the TAP controller 7, control signals CLKIR, SFIR, UPDIR, CLKDR, SFDR, and UPDDR output from the TAP controller 7 are supplied to sub-test circuits 1a, 1b, 3a, 3b, 5, and 6. The TAP controller 7 controls an operation of externally setting a value in the failure information storage method designating register 18 or an operation of outputting failure information from the failure information storage register 17 to the outside as described below.

As shown in FIG. 3, a signal is externally input to store failure information retrieved from plural memories 2a and 2b in the memory test circuit 1a and 1b and send out the information to the outside. That is, an externally supplied signal passes through a connection line of an external terminal TDI, the memory test mode controller circuit 5, a TMCHAIN1, the memory test circuit 1a, an FBOUT1, a TMCHAIN2, the memory test circuit 1b, an FBOUT2, a TMCHAIN3, and an external terminal TDO, and failure information is output. A connection line for outputting the failure information is activated by a signal CONTROL1 output from the instruction controller circuit 6 of FIG. 3 under the mode 2 or mode 3 of FIG. 4.

Figure 5:
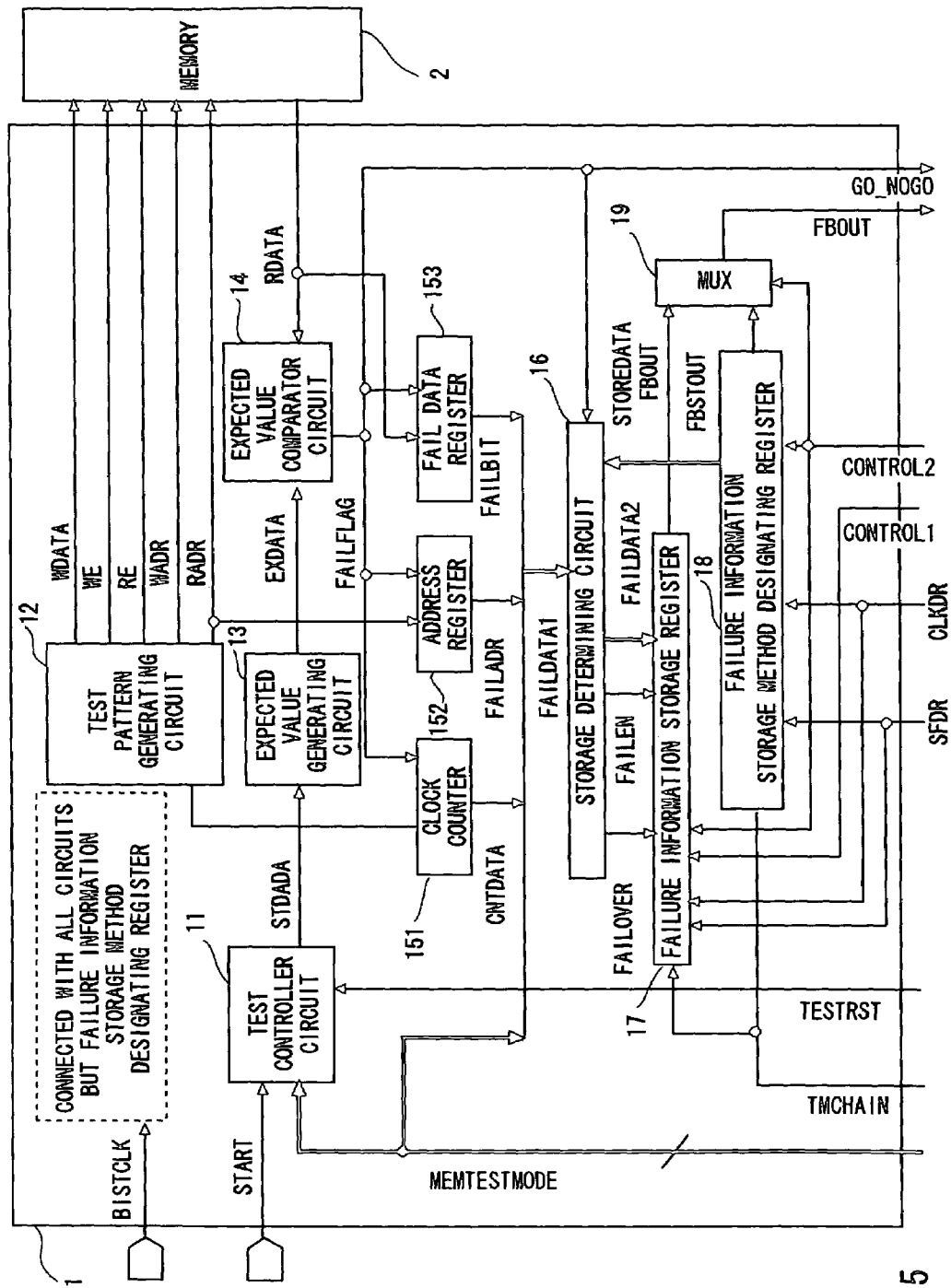
FIG. 5 is a circuit diagram showing the configuration of the memory test circuit according to the embodiment of the present invention.

FIG. 5 shows the internal configuration of the memory test circuit 1 (1a and 1b) of FIG. 3. The test controller circuit 11 controls generation of patterns for testing the memory 2 and expected values. The test controller circuit 11 receives a pattern mode signal MEMTESTMODE designating which pattern is generated, and a memory test start control signal START, and outputs a memory test pattern control signal STDATA.

The test pattern generating circuit 12 generates a write control signal WE, a write address WADR, write data WDATA, a read control signal RE, and a read address RADR as a memory test pattern based on the control signal STDATA output from the test controller circuit 11, and outputs the generated one to the memory 2.

The expected value generating circuit 13 generates an expected value corresponding to the memory test pattern generated with the test pattern generating circuit 12 based on the control signal STDATA output from the test controller circuit 11.

The expected value comparator circuit 14 compares the data output signal RDATA read from the memory 2 with the expected value EXDATA generated with the expected value generating circuit 13 on a bit basis. If the expected value does not match the read value, it is determined that a failure is found, a fail signal (active=1) is output as a pass/fail signal FAILFLAG.

The clock counter 151 starts counting from the time when the test pattern generating circuit 12 starts outputting a test pattern. Each time one pattern is output to the memory 2, that is, every action, the count value increments by one. The clock counter 151 receives the pass/fail signal FAILFLAG from the expected value comparator circuit 14. If a fail signal is output as the pass/fail signal FAILFLAG, the count value of this time, that is, the count value corresponding to the fail signal is output as a signal CNTDATA. The count value represents where in the order of actions the memory test executed on a memory cell determined as a defective cell is. Based on the count value, an action executed on the memory cell determined as a defective cell can be specified.

The address register 152 holds an address signal RADR (address value) corresponding to a data output signal RDATA read from the memory 2 and compared by the expected value comparator circuit 14. The address register 152 receives the pass/fail signal FAILFLAG from the expected value comparator circuit 14. If a fail signal is input as the pass/fail signal FAILFLAG, an address value of this time is output as a signal FAILADR.

The fail data register 153 holds a data output signal RDATA (data output value) read from the memory 2 and compared by the expected value comparator circuit 14. The fail data register 153 receives a pass/fail signal FAILFLAG from the expected value comparator circuit 14. If a fail signal is input as the pass/fail signal FAILFLAG, a data output value of this time is output as a signal FAILBIT.

The selector 19 is a selector circuit (MUX) selecting a signal output from the memory test circuit. The selector 19 selects an output signal FBOUT from the failure information storage register 17 or an output signal FBOUT from the failure information storage method designating register 18 to output the selected one. The selector 19 executes such control based on the control signal CONTROL2 output from the instruction controller circuit 6 of FIG. 3. In the case where the memory test circuit sends out the output signal FBOUT of the failure information storage register 17, the selector 19 receives "0" as the signal CONTROL2 as is set by the mode 3 of FIG. 4. In the case where the memory test circuit outputs an output signal FBOUT of the failure information storage method designating register 18, the selector 19 receives "1" as the signal CONTROL2 as is set by the mode 2 of FIG. 4.

The failure information storage method designating register 18 is a register for setting storage conditions for detected failure information, and includes shift registers. The failure information storage method designating register 18 receives a shift operation control signal SFDR and a shift clock signal CLKDR output from the TAP controller 7 of FIG. 3, and a control signal CONTROL2 output from the instruction controller circuit 6 of FIG. 3. In the instruction controller circuit 6 of FIG. 3 under the state of the mode 2 of FIG. 4, a value designating the storage conditions supplied from the TMCHAIN is set in the failure information storage method designating register 18.

If the pass/fail signal FAILFLAG input from the expected value comparator circuit 14 is a fail signal, the storage determining circuit 16 caries out storage determination as shown in FIG. 7 based on the storage method control signal STOREDATA set in the failure information storage method designating register 18 and the input failure information signal FAILDATA1. If the storage conditions are met, the failure information FAILDATA2 is output to the failure information storage register 17. As described below, the storage determining circuit 16 determines whether or not conditions specified by a storage mode (a storage method code register, a storage method condition value register, a failure detection number, and a failure address), that is, conditions of FIG. 7 are met. If the conditions are met, the failure information FAILDATA2 is output and stored in the failure information storage register 17.

The failure information storage register 17 stores the detected failure information, and includes shift registers. The failure information storage register 17 receives shift operation control signal SFDR and a shift clock signal CLKDR output from the TAP controller 7 of FIG. 3, and control signals CONTROL1 and CONTROL2 output from the instruction controller circuit 6 of FIG. 3. The failure information storage register 17 stores the failure information FAILDATA2 in the instruction controller circuit 6 of FIG. 3 under the mode 1 of FIG. 4. Then in the state of the mode 3 of FIG. 4, the failure information stored in the failure information storage register 17 is output to the output signal FBOUT in accordance with the shift operation control signal SFDR and the shift clock signal CLKDR.

Figure 6:
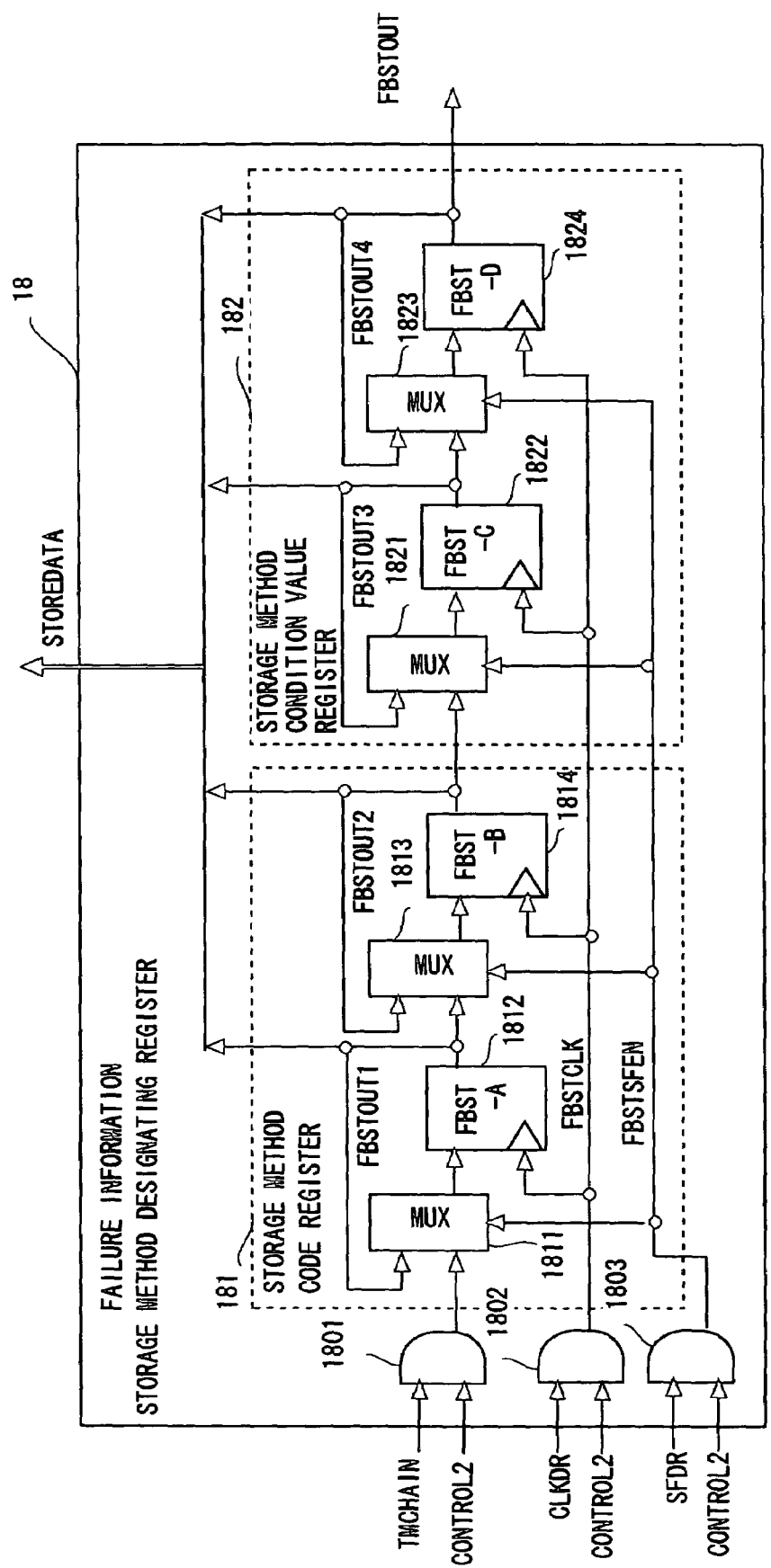
FIG. 6 is a circuit diagram showing the configuration of a failure information storage method designating register according to the embodiment of the present invention.

FIG. 6 shows the configuration example of the failure information storage method designating register 18. The failure information storage method designating register 18 includes a storage method code register 181 and a storage method condition value register 182.

The storage method code register 181 stores a code value determining a failure information storage method (storage standard). In this example, the failure information storage method includes, for example, information specifying and designating the ordinal position of failure information to be stored in the detected failure information such as "to store failures from the nth detected failure from the test start position". Further, failure information storage information includes information designating an address of failure information to be stored as a condition such as "to store failures detected at n or more addresses" or "to failures detected at addresses other than the address n. In this embodiment, a method "to store failures from the nth detected failure from the test start position" in the storage mode 1 is set. In this case, as shown in the storage mode 1 of FIG. 7, "00 (binary number)" is set in the storage method code register 181.

In addition, in the case of setting a method "to store failures detected at n or more addresses" in the storage mode 2, as shown in FIG. 7, "01 (binary number)" is set in the storage method code register 181. Further, in the case of setting a method "to store failures detected at addresses other than the address n" in the storage mode 3, as shown in FIG. 7, "10 (binary number)" is set in the storage method code register 181. In the case of setting a method "to store only a failure at an address n" in the storage mode 4, as shown in FIG. 7, "11 (binary number)" is set in the storage method code register 181. In this way, the storage method can be changed based on the preset value of the storage method code register 181.

The storage method condition value register 182 sets storage conditions in the storage method set in the storage method code register 181. As for the storage method "to store failures from the nth failure from the test start position" as in this example, "11 (binary number)" is set in the storage method condition value register 182 to set the storage conditions "to store failures from the third detected failure from the test start position".

In addition, as for the storage method "to store a failure detected at nor more addresses", storage conditions that failures detected at an address-not smaller than a preset value n of the storage method condition value register 182 are stored are set. As for the storage method "to store a failure detected at addresses other than the address n", the storage conditions that failures detected at addresses other than a preset value n of the storage method condition value register 182 are stored are set. As for the storage method "to store only a failure detected at an address n", the storage conditions that a failure detected at-an address that is a preset value n of the storage method condition value register 182 is stored are set.

As shown in FIG. 6, the storage method code register 181 and the storage method condition value register 182 are configured by shift registers. The storage method code register 181 includes registers FBST-A1812 and FBST-B1814, and the storage method condition value register 182 includes the registers FBST-C1822 and FBST-D1824. The signals TMCHAIN, CLKDR, and SFDR input to the registers FBST-A1812 to FBST-D1824 are controlled through the gate circuits 1801, 1802, and 1803 by the control signal CONTROL2. When the control signal CONTROL2 is "1", these signals are supplied. The shift operation control signal SFDR controls the selectors 1811, 1813, 1821, and 1823 to switch input values of the registers FBST-A1812 to FBST-D1824 to selectively shift or hold the signals from TMCHAIN. The input data are shifted in accordance with the shift clock signal CLKDR.

If "1" is input to the control signal CONTROL2 from the instruction controller circuit 6 of FIG. 3 in the mode 2 of FIG. 4, storage method set values are shifted and input to the registers FBST-A1812 to FBST-D1824 of the storage method code register 181 and the storage method condition value register 182 through TMCHAIN based on the shift operation control signal SFDR and the shift clock signal CLKDR output from the TAP controller 7 of FIG. 3. During the memory test, since "0" is output as the signal CONTROL2 in the mode 1 of FIG. 4, output values of the register FBST-A1812 to FBST-C1824 form a self-loop, and the held data is output as STOREDATA.

Figure 8:
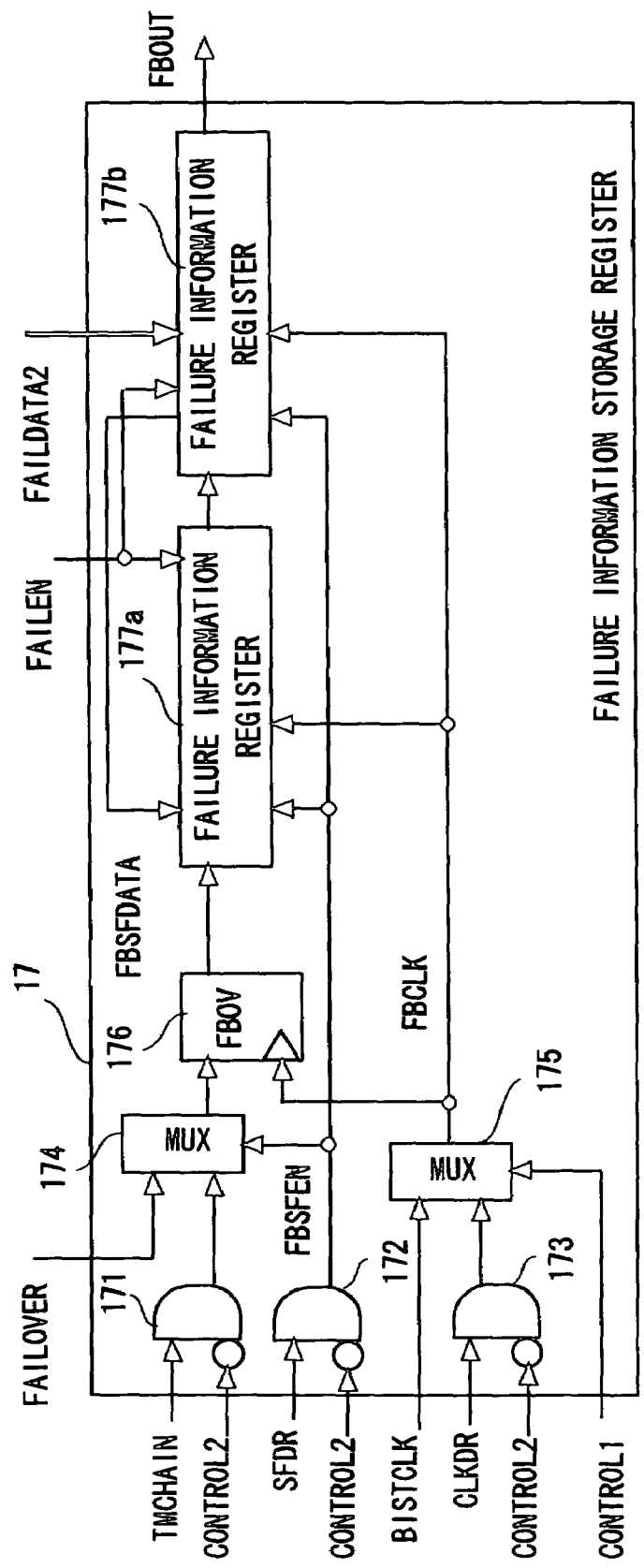
FIG. 8 is a circuit diagram showing the configuration of a failure information storage register according to the embodiment of the present invention.

FIG. 8 shows the configuration example of the failure information storage register 17. The failure information storage register 17 includes registers 177*a* and 177*b* storing failure information and a register 176 (FBOV or FBO) storing a flag value representing that a failure is detected.

The register 176 stores a flag value indicating that a failure is found beyond the storage limitation. An initial value of the register 176 is "0". If it is determined that the number of failures exceeds a storage capacity of the storage determining circuit 16 of FIG. 5, the storage determining circuit 16 inputs a signal FAILOVER, and a flag "1" indicating that the number of failures is beyond the storage limitations is set in the register 176.

Figure 9:
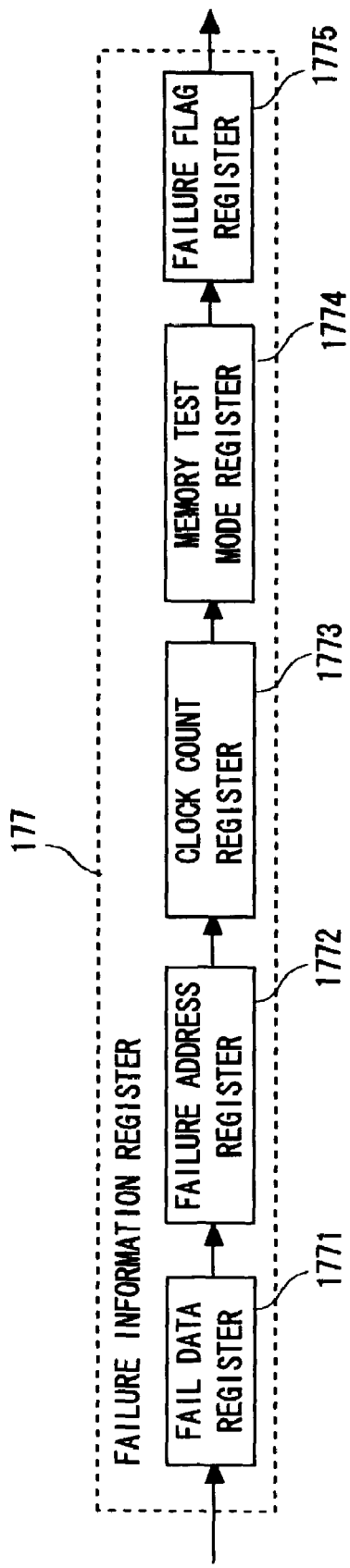
FIG. 9 is a circuit diagram showing the configuration of a failure information register according to the embodiment of the present invention.

The registers 177*a* and 177*b* store the failure information. The registers 177*a* and 177*b* (177) include registers 1771, 1772, 1773, 1774, and 1775 storing fail data, a failure address, a clock count value at the time of detecting a failure, a memory test mode, and a fail flag of FIG. 9, respectively. In this embodiment, the number of storage failure information is set to 2. Further, a memory to be tested has 4 addresses and stores 3-bit data. Thus, as shown in FIG. 9, the fail data register 1771 is given 3 bits. The failure address register 1772 is given 2 bits. The clock count register 1773 is given 6 bits so that up to the count value 40 can be stored in accordance with the memory test pattern of FIG. 11. The memory test mode register 1774 is given 8 bits. The fail flag register 1775 is given 1 bit. The number of stored failure information is 2, so the failure information storage register 17 includes registers of 41 bits (FBO to FB40).

The failure information register 177*a* stores a value of the signal FAILDATA2 in the case where the storage conditions are met in the storage determining circuit 16 of FIG. 5. The signal FAILDATA2 includes an output FAILBIT of the fail data register 153 of FIG. 5 (data output value in failure), an output FAILADR of the address register 152 (address value in failure), an output CNTDATA of the clock counter 151 (count value in failure), an output MEMTESTMODE of the memory test mode controller circuit 5 of FIG. 3, and a pass/fail signal FAILFLAG from the expected value comparator circuit 14 of FIG. 5.

At the time of storing new failure information in the failure information register circuit 177*a*, previous failure information stored in the failure information register 177*a* is shifted and input to the failure information register 177*b*.

The signals TMCHAIN, CLKDR, and SFDR input to each register in the failure information storage register 17 are controlled based on the control signal CONTROL2 through gate circuits 171, 172, and 173, and these signals are supplied if the control signal CONTROL2 is "0". The signal SFDR is supplied as a signal FBSFEN. Based on the signal FBSFEN, registers are switched through the selector 174 to selectively shift or hold the signals TMCHAIN, FAILOVER, FAILEN, and FAILDATA2. The clock signal FBCLK input to each register in the failure information storage register 17 is controlled based on the control signal CONTROL1 through the selector 175 to selectively supply the clock signal BISTCLK or CLKDR.

Figure 10:
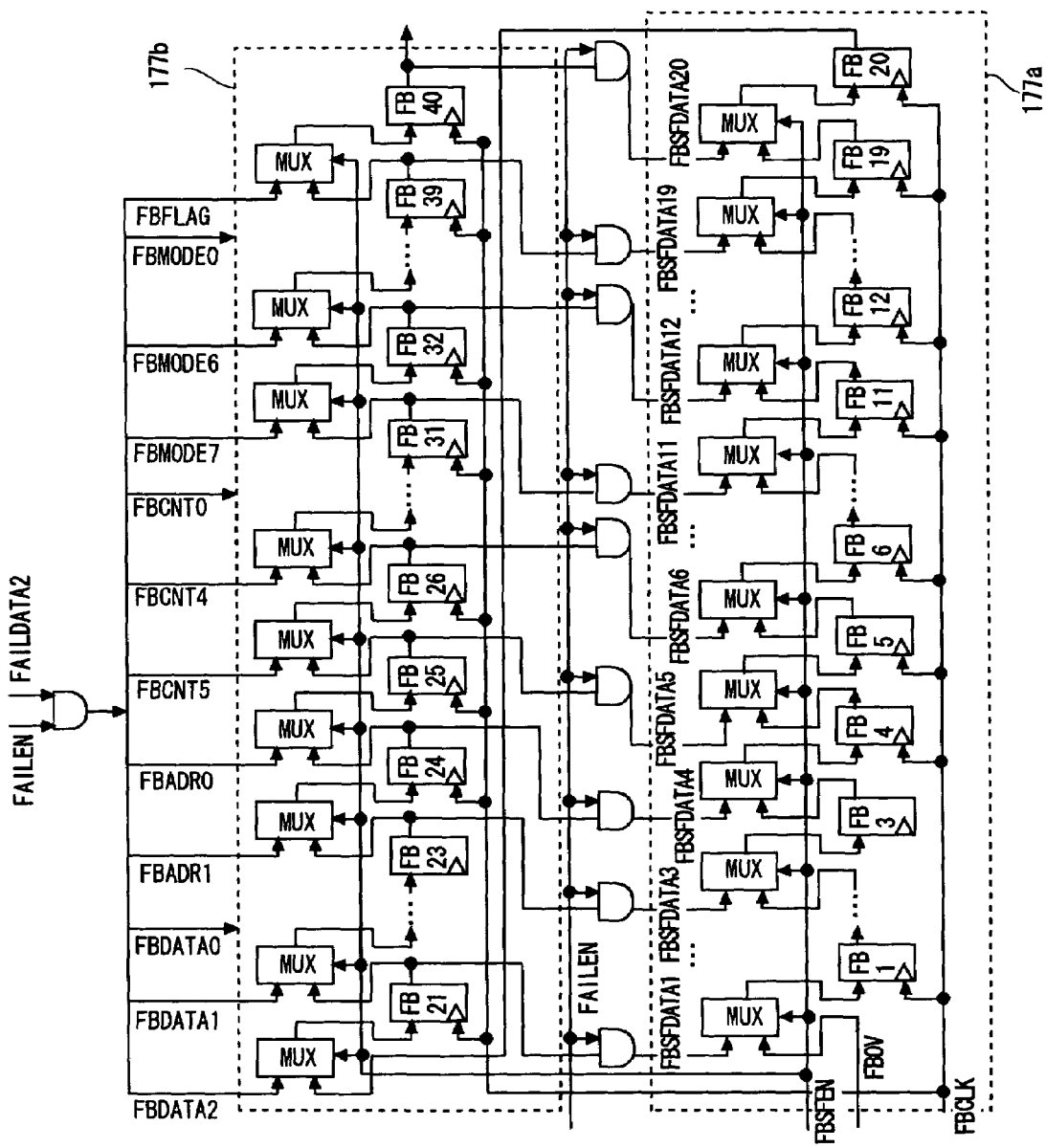
FIG. 10 is a circuit diagram showing the configuration of a failure information register circuit according to the embodiment of the present invention.

FIG. 10 shows the circuit configuration of the failure information register 177*a* and the failure information register 177*b*. The failure information register 177*a* includes registers FB1 to FB20, and the failure information register 177*b* includes registers FB21 to FB40.

During the memory test, the shift operation control signal SFDR output from the TAP controller 7 of FIG. 3 is "0", so the signal FBSFEN is "0", and a signal FAILDATA2 is input to the failure information register 177*b*. Further, shift input signals FBSFDATA 1 to FBSFDATA 20 from the failure information register 177*b* are input to the failure information register 177*a*. At this time, the clock signal FBCLK input to the registers 176, 177*a* and 177*b* is BISTCLK for executing memory test because the control signal CONTROL1 connected with the selector 175 of FIG. 8 is "0" under the state of the mode 1 of FIG. 4. In the case of outputting the failure information stored in the failure information storage register 17 to the outside, the instruction controller circuit 6 of FIG. 3 is shifted to the state of the mode 3 as shown in FIG. 4. In the mode 3, the control signal CONTROL1 is "1", so the clock signal FBCLK input to the register circuits 176, 177*a* and 177*b* is a shift clock signal CLKDR output from the TAP controller 7 of FIG. 3. "0" is input as the control signal CONTROL2, and the shift operation control signal SFDR becomes active (value of "1"), so the signal FBSFEN is "1". Then, the register 176 and registers FB0 to FB40 constituting the failure information registers 177*a* and 177*b* perform shift operation, and failure information is output to FBOUT.

Storing the failure information of the failure information storage register 17 is executed in accordance with the clock signal BISTCLK (high-frequency clock) used in the memory test based on the control signal CONTROL1 of the instruction controller circuit 6. Thus, memory test can be carried out at a speed conforming to the memory actual specifications. Then, if the stored failure information is retrieved, it is possible to output information at such a speed as can be measured by a tester based on the shift clock signal CLKDR (low-frequency clock) output from the TAP controller 7 of FIG. 3.

Referring to a flowchart of FIG. 12, an operation of analyzing a failure in the memory test circuit of this embodiment is described next. In this embodiment, the memories 2*a* and 2*b* to be tested have 4 addresses and store 3-bit data. The number of stored failure information is 2, and the failure information storage method is "to start with storage of the third detected failure information". Further, it is assumed that the memories 2a and 2b have such failures that data bit 0 of an address 2 is fixed to "1" and all data bits of an address 3 are fixed to "1".

Figure 12:
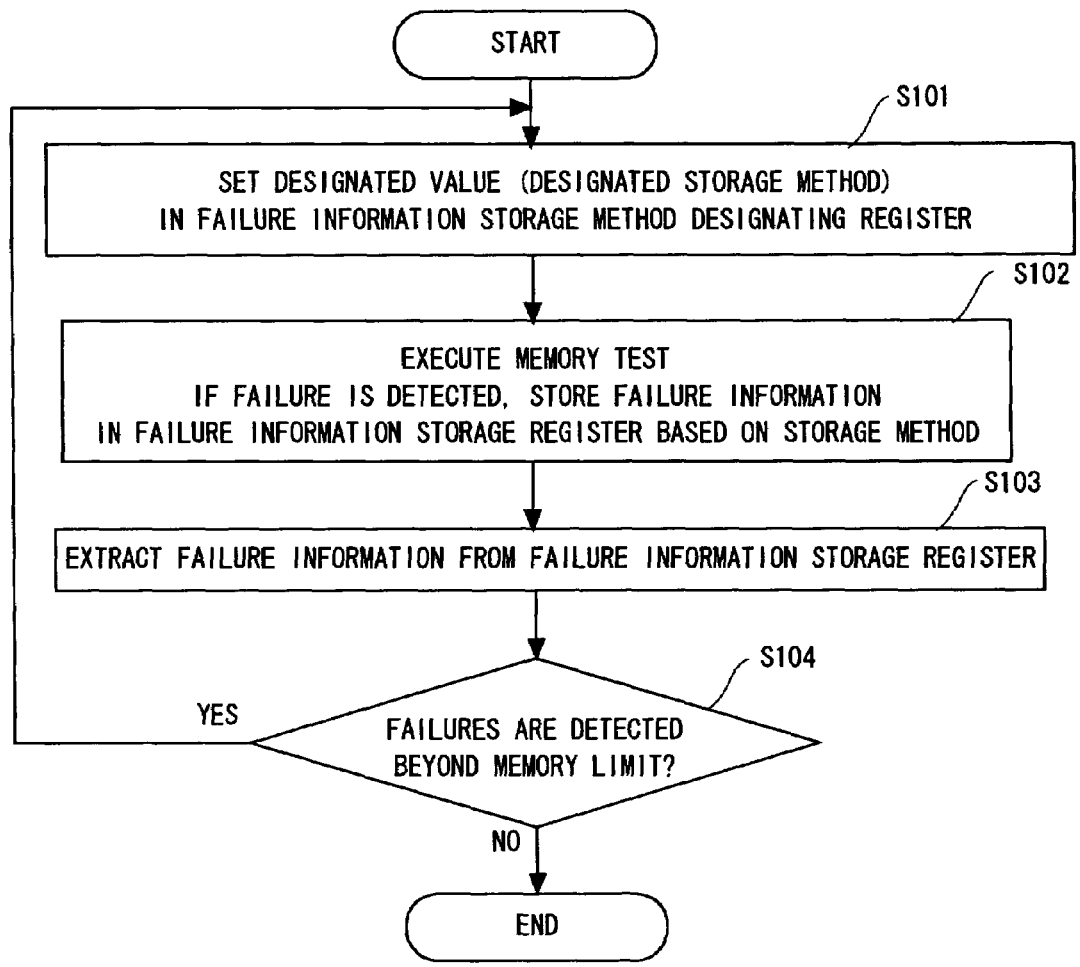
FIG. 12 is a flowchart showing an outline of a failure analyzing method for the test circuit according to the embodiment of the present invention.

First, in S101 of the flowchart of FIG. 12, an operation of setting a storage method in the failure information storage method designating register 18 is performed. First, the instruction controller circuit 6 of FIG. 3 is set to the mode 2 defined by the table of FIG. 4. As a result, "1" is output as the control signal CONTROL2. Then, a set value of the storage method from the external terminal TDI is input to the failure information storage method register 18 as shown in FIG. 6 through TMCHAIN. Based on the shift operation control signal SFDR and the clock signal CLKDR output from the TAP controller 7 of FIG. 3, the values input from TMCHAIN are shifted and input to the registers FBST1 to FBST4 constituting the failure information storage method register 18 of FIG. 6. Since the storage method is "to start with the storage of the third detected failure information", this corresponds to the storage mode 1 as understood from the table of FIG. 7. {"0", "0"} is set to {FBST1, FBST2} of the storage method code register 181 of FIG. 6, and {"1", "1"} is set as a binary value representing the third one to {FBST3, FBST4} of the storage method condition value register 182.

Next, in S102 of the flowchart of FIG. 12, the memory test is carried out. That is, the instruction controller circuit 6 of FIG. 3 is set to the mode 1 defined by the table of FIG. 4. Then, "0" is output as the control signals CONTROL1 and CONTROL2. The test mode registers 3a and 3b of FIG. 3 output signals TESTRST1, TESTRST2 to input a set value for making the memory test circuits 1a and 1b active and a pattern mode signal value input to the memory test mode controller circuit 5 for generating a sub-test pattern of the memory test pattern of FIG. 11 from the memory test circuit 1a and 1b through the external terminal TDI. This operation is also controlled based on the shift operation control signal SFDR, and the clock signal CLKDR output from the TAP controller 7 of FIG. 3. 8 bits of address mode "3'b101", Read/Write mode "3'b101", and data mode "2'b11" as the pattern mode signal of the sub-test pattern of FIG. 11 are set in the memory test mode controller circuit 5.

Then, a signal START is made active based on external operations. The memory test circuits 1a and 1b thereby start memory test in accordance with a pattern of FIG. 11. During the memory test, the control signal SFDR and the clock signal CLKDR output from the TAP controller 7 of FIG. 3 are both "0", and a signal FBSFEN of FIG. 8 becomes "0". Then, the signal line of signals FAILDATA2 and FBSFDATA for storing the failure information to the failure information register circuit 177a and 177b is activated. Further, since the signal CONTROL1 is "0", the failure information storage register 17 operates based on the BISTCLK signal.

First, data of address 2 with Pattern-Number 6 in the table of FIG. 11 is read from the memory 2 of FIG. 5 as the signal RDATA. The expected value comparator circuit 14 of FIG. 5 compares the read data with the expected value signal EXDATA from the expected value generating circuit 13. A failure is detected at the data bit 0, and the signal FAILFLAG becomes active (value of "1"), and a failure information signal FAILDATA1 is input to the storage determining circuit 16 of FIG. 5.

Figure 13:
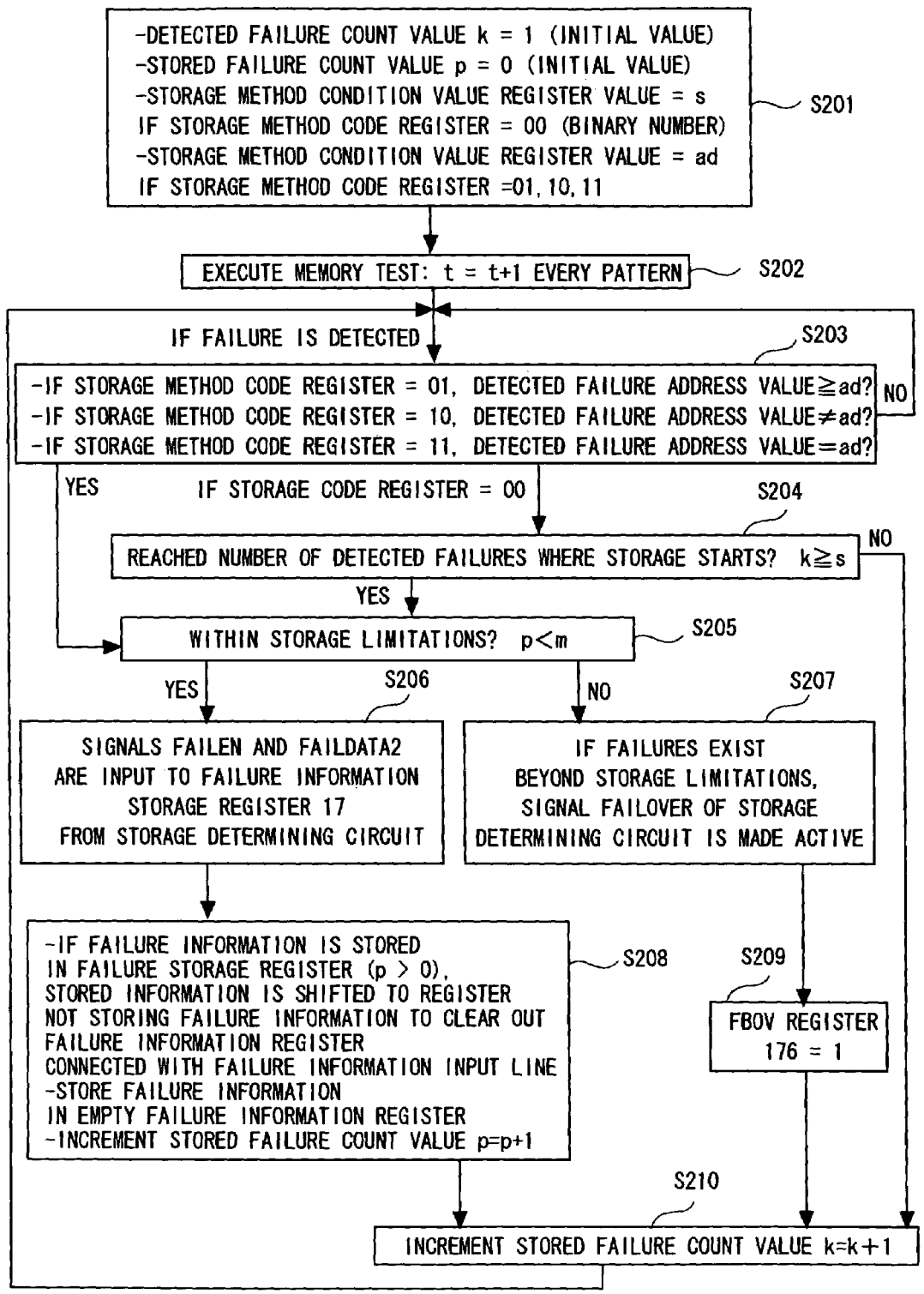
FIG. 13 is a flowchart of operations of a storage determining circuit and a failure information storage register according to the embodiment of the present invention.

In the storage determining circuit 16 of FIG. 5, storage determination is performed in accordance with the flowchart of FIG. 13 based on the signal STOREDATA from the failure information storage method designating register 18.

That is, the storage determining circuit 16 resets a count value k of detected failures and a count value p of stored failures in S201. The storage method condition value register 182 is set in accordance with a value of the storage method code register 181 (storage mode). In S202, the memory test is executed to increment the value t every test pattern. When a failure is detected in the memory test, a detected failure address is determined in the storage modes 2 to 4 in S203 in accordance with the value of the storage method code register 181. In the storage mode 1, it is determined whether or not k reaches the number of detected failures from which the storage is started, in accordance with the value of the storage method code register 181, in S204. If the conditions are met in S203 or S204, it is determined whether or not p is within storage capacity in S205. If the conditions are met in S205, the storage determining circuit 16 outputs the signal FAILEN and FAILDATA2 to store these in the failure information storage register 17 in S206. If the failure information has been stored in the failure information storage register 17 in S208, the stored failure information is shifted to a register not storing failure information, and the failure information is stored in an empty failure information register to increment the number of stored failures p. If the conditions are not met in S205, the signal FAILOVER of the storage determining circuit 16 is made active in S207, and "1" is set in the register 176 in S209. In S210 after S208 or S209, the number of detected failures k is incremented to repeat the memory test.

In this example, since the storage method is "to start with the storage of the third detected failure", the conditions are not met in S204 of FIG. 13, so the number of detected failures is incremented in S210. Similarly, a failure is detected at an address 3 in Pattern-Number 8 of the table of FIG. 11, but the conditions are not met, so the operation of S210 is only executed. A failure detected at the address 2 in Pattern-Number 16 of the table of FIG. 11 is the third detected failure. The conditions of S204 of FIG. 13 are meet with the storage determining circuit 16, and the conditions of S205 are met to perform the storage operations of S206 and S208.

The failure information FAILDATA2 is output from the storage determining circuit 16 of FIG. 5 to input the failure information storage register 17. At this time, the signal FAILEN output from the storage determining circuit 16 is made active (value of "1"). The failure information FAILDATA2 is input to the failure information register 177b as shown in FIG. 8. A fail data register 1771 (register {FB21, FB22, FB23} of FIG. 10) of FIG. 9 stores a value {0, 0, 1} representing a data output value "001" in failure. A failure address register 1772 (register {FB24, FB25} of FIG. 10) stores a value {1, 0} representing the address 2 in failure. The clock count register 1773 (register {FB26 to FB31} of FIG. 10) stores a value {0, 1, 0, 0, 0, 0} representing the clock count value 16. The memory test mode register 1774 stores a value {1, 0, 1, 1, 0, 1, 1, 1} representing a pattern mode {"101", "101", "11"} (register {FB32 to FB39} of FIG. 10) of FIG. 11. The fail flag register 1775 stores a value {1} representing that a failure is found (in the register {FB40} of FIG. 10). At this time, the number of stored failure information in S208 of FIG. 13 is 1 (p=1).

Next, a failure is detected at an address 3 in Pattern-Number 18 of the table of FIG. 11. The conditions of S204 and S205 of FIG. 13 are met to carry out the storage operations of S206 and S207. The previous detected failure information stored in the register FB21 to FB40 constituting the failure information register 177b of FIG. 10 are shifted and input to the registers FB1 to FB20 constituting the failure information register 177a of FIG. 10 through the signals FBSFDATA 1 to FBSFDATA 20 after the signal FAILEN output from the storage determining circuit 16 of FIG. 5 is made active (value of "1"). The failure information FAILDATA2 is input to the failure information register 177b of FIG. 8. -The fail data register 1771 (register {FB21, FB22, FB23} of FIG. 10) of FIG. 9 stores a value {1, 1, 1} representing the data output value "111" in failure. The failure address register 1772 (register {FB24, FB25} of FIG. 10) stores a value {1, 1} representing an address 3 in failure. The clock count register 1773 (register {FB26 to FB31} of FIG. 10) stores a value {0, 1, 0, 0, 1, 0} representing the clock count value 18. The memory test mode register 1774 (register {FB32 to FB39} of FIG. 10) stores a value {1, 0, 1, 1, 0, 1, 1, 1} representing the pattern mode {"101", "101", "11"} of FIG. 11. The fail flag register 1775 (register {FB40} of FIG. 10) stores a value {1} representing that a failure is found. At this time, the number of stored failure information in S208 of FIG. 13 is 2 (p=2).

Further, a failure is detected at an address in Pattern-Number 21 of the table of FIG. 11. The storage determining circuit 16 of FIG. 5 executes a flow processing of FIG. 13. At this time, the conditions of S204 of FIG. 13 are met, but in S205, the number of failure information exceeds the number of storable information, that is, 2, so the process advances to S207 and S209. The signal FAILOVER representing that the number of failure information exceeds the number of storage information is made active (value of "1") and output from the storage determining circuit 16 of FIG. 5. The flag signal is stored in the register 176 (FBOV) of FIG. 8. Regarding failures detected from then on, the operations of S207 and S209 of FIG. 13 are similarly executed.

After the completion of the memory test, in S103 of the flowchart of FIG. 12, the failure information is output from the failure information storage register. That is, the instruction controller circuit 6 of FIG. 3 is set to the mode 3 defined by the table of FIG. 4. The control signal CONTROL1 becomes "1", and the CONTROL2 becomes "0". As a result, the failure information stored in the failure information storage register 17 of FIG. 5 is output to the outside through the signal FBOUT. The control signal CONTROL1 is "1", so the clock signal FBCLK input to the registers 176, 177*a* and 177*b* of FIG. 8 becomes the shift clock signal CLKDR output from the TAP controller 7 of FIG. 3. Since "0" is input as the control signal CONTROL2, and the shift operation control signal SFDR is made active (value of "1"), the information is shifted and output from FBOUT in the order from the failure information register 177*b* of FIG. 8 (register {FB40 to FB21} of FIG. 10), the failure information register 177*a* (register {FB20 to FB1} of FIG. 10), and the register 176 (FBOV). This operation is carried to in the memory test circuits 1*a* and 1*b* of FIG. 3, and the failure information detected with the memory 2*b* and the failure information detected with the memory 2*a* are output in this order from the external terminal TDO.

In this embodiment, it is understood from the output failure information that the memories 2*a* and 2*b* are tested with a sub-test pattern of the memory test pattern illustrated in FIG. 11 and corresponding to the memory test mode information {"101", "101", "11"}. It is understood from the clock count value that failures are found in the pattern 16 and the pattern 18 in the sub-test pattern, and failures of data "001" and data "111" are found at an address 2 and address 3, respectively. Further, it is apparent from the flag information that failures remain to be stored, and failures exist beyond the storage limitations.

Next, in S104 of the flowchart of FIG. 12, failures exist beyond the storage limitations, so the settings of the storage method of S101 are changed and the above operations are repeated for obtaining the failure information.

This embodiment can overcome a problem of the Related Art 1 that a failure portion cannot be checked unless a sub-test pattern of the executed memory test pattern is grasped. That is, a pattern mode signal MEMTESTMODE designating a sub-test pattern for generating the memory test circuit 1*a* and 1*b*, which is output from the memory test mode controller circuit 5 of FIG. 3, is stored in the memory test mode register 1774 in the failure information registers 177*a* and 177*b* of FIG. 9. Thus, after executing the other sub-test patterns of the memory test pattern inclusive of the sub-test pattern of FIG. 11, when the failure information is retrieved, the pattern mode stored in the memory test mode register 1774 is checked, making it possible to determine which sub-test pattern in the memory test pattern a failure is found in.

Further, this embodiment can overcome the problem of the Related Art 2 that it is impossible to determine which sub-test pattern of the executed memory test pattern involves a failure or determine an ordinal position of the sub-test pattern where a failure occurs. That is, the pattern number of the pattern counted by the clock counter 151 from when the sub-test pattern of the memory test pattern is output from the test pattern generating circuit 12 of FIG. 5 is stored in the clock count register 1773 constituting the failure information registers 177*a* and 177*b* of FIG. 9. As described above, the pattern mode stored in the memory test mode register 1774 and a value stored in the clock count register 1773 are checked to thereby determine an ordinal position of a sub-test pattern where a failure occurs.

Further, this embodiment can overcome a problem of the Related Arts 1 and 2 in that the failure information cannot be stored up to a preset size, and it is impossible to grasp the failure information beyond the preset size. That is, the failure information storage method designating register 18 and the storage determining circuit 16 of FIGS. 5 and 6 are prepared, and the failure information storage method designating register 18 externally sets a storage method of failure information. In accordance with the storage determination of the storage determining circuit 16 as shown in FIG. 7, the failure information storage operation of FIG. 11 is executed. In the above example, the storage method is changed such as setting the storage method "to start with the storage of the third detected failure", to repeat storage of the failure information and output of the information to the outside in accordance with the flow of FIG. 12 to thereby collect the failure information beyond the storage limitations. Further, whether or not failures remain to be stored can be determined by preparing a flag register 176 representing that failures exist beyond the storage limitations as shown in FIG. 8.

As set forth above, according to this embodiment, it is possible to determine which sub-test pattern of the memory test pattern involves a failure or determine an ordinal position of a sub-test pattern where the failure is detected in the memory test pattern in addition to data output and an address upon failure detection as memory failure information. Further, according to this embodiment, a circuit for controlling the storage method of failure information such as "to store a failure in which ordinal position", and "to store a failure detected at which addresses or more" and a register corresponding to 1 bit representing whether or not failures are detected beyond the storage limitations are prepared, making it possible to check failures for all addresses of a memory to be tested.

It is apparent that the present invention is not limited to the above embodiment that may be modified and changed without departing from the scope and spirit of the invention.

What is claimed is:

1. A memory test circuit, comprising:
a testing unit testing a memory in accordance with a pattern mode signal designating a sub-test pattern included in a test pattern and including a plurality of test actions for the memory;
a test pattern generating circuit generating a test pattern corresponding to the pattern mode signal; and
a storage unit storing the pattern mode signal as failure information.

2. The memory test circuit according to claim 1, wherein the testing unit includes:
an expected value generating circuit generating an expected value in accordance with the pattern mode signal; and
an expected value comparator circuit comparing output data from the memory with an expected value generated with the expected value generating circuit, and
the storage unit includes a failure information storage circuit storing failure information detected with the expected value comparator circuit together with the pattern mode signal.

3. The memory test circuit according to claim 1, further comprising:
a counter counting the number of actions constituting the sub-test pattern,
wherein the storage unit includes a failure information storage circuit, and the failure information storage circuit stores a count value corresponding to a failure detected with an expected value comparator circuit as the failure information.

4. The memory test circuit according to claim 1, further comprising:
a storage determining circuit determining whether or not failure information detected with an expected value comparator circuit is stored in a failure information storage circuit in accordance with preset failure information storage method information.

5. The memory test circuit according to claim 1, wherein a failure information storage method information includes information designating failure information to be stored out of detected failure information by specifying an ordinal position from a detection start position, and
a storage determining circuit stores failure information corresponding to the ordinal position in the failure information storage circuit.

6. The memory test circuit according to claim 1, wherein failure information storage method information includes information designating an address of failure information to be stored out of the detected failure information as a condition, and
a storage determining unit stores failure information corresponding to the condition in the failure information storage circuit.

7. A memory test circuit, comprising:
a failure information detecting circuit detecting failure information of a memory;
a failure information storage circuit; and
a storage determining circuit determining whether or not failure information detected with the failure information detecting circuit is stored in the failure information storage circuit based on preset failure information storage method information, and the failure information storage circuit includes a flag storage circuit, whereby if the number of failure information exceeds the number of storable failure information, a value representing that the number of failure information exceeds the number of storable failure information is stored in the flag storage circuit.

8. The memory test circuit according to claim 7, wherein the failure information storage method information includes information designating failure information to be stored out of the detected failure information by specifying an ordinal position from a detection start position, and
the storage determining circuit stores failure information corresponding to the ordinal position in the failure information storage circuit.

9. The memory test circuit according to claim 7, wherein the failure information storage method information includes information designating an address of failure information to be stored out of the detected failure information as a condition, and
the storage determining circuit stores failure information corresponding to the condition in the failure information storage circuit.

10. A memory test method, comprising:
generating a test pattern corresponding to a pattern mode signal designating a sub-test pattern included in the test pattern and including a plurality of test actions for the memory;
executing a test on a memory in accordance with the test pattern corresponding to the pattern mode signal designating a sub-test pattern included in a test pattern and including a plurality of test actions for the memory; and
storing the pattern mode signal as failure information.

11. A memory test method, comprising:
detecting failure information of a memory;
determining whether or not to store the detected failure information in accordance with preset failure information storage method information, and
if the number of failure information exceeds the number of storable failure information, setting a value representing that the number of failure information exceeds the number of storable failure information in a flag of a storage circuit.

* * * * *